United States Patent

Tsukazaki et al.

[11] Patent Number: 5,837,094
[45] Date of Patent: Nov. 17, 1998

[54] SEMICONDUCTOR MANUFACTURING APPARATUS

[75] Inventors: Hisashi Tsukazaki; Makoto Doi; Shigemi Miyazaki; Akira Oohisa, all of Tokyo, Japan

[73] Assignee: Mitsubishi Denki Kabushiki Kaisha, Tokyo, Japan

[21] Appl. No.: 798,117

[22] Filed: Feb. 12, 1997

[30] Foreign Application Priority Data

Mar. 25, 1996 [JP] Japan .................................. 8-068452

[51] Int. Cl.$^6$ .................................................. C23C 16/00
[52] U.S. Cl. ................. 156/345; 118/723 R; 134/104.3; 204/298.02; 204/298.31
[58] Field of Search ........................ 156/345; 118/723 R, 118/723 MP, 723 MW, 723 ME, 723 MR, 723 MA, 723 AN, 723 E, 723 ER, 723 I, 723 IR; 134/56 R, 104.1, 104.2, 104.3, 104.4; 204/298.01, 298.02, 298.03, 298.31, 298.32

[56] References Cited

U.S. PATENT DOCUMENTS

| 5,083,865 | 1/1992 | Kinney et al. ........................ 356/338 |
| 5,271,264 | 12/1993 | Chanayem .............................. 73/28.01 |
| 5,424,558 | 6/1995 | Boden et al. ........................... 250/573 |
| 5,525,158 | 6/1996 | Tsukazaki et al. ................ 118/723 CB |

FOREIGN PATENT DOCUMENTS 7-169693  7/1995  Japan .
8-8219    1/1996  Japan .

Primary Examiner—Robert Kunemund
Assistant Examiner—Luz Alejandro
Attorney, Agent, or Firm—Burns, Doane, Swecker & Mathis, LLP

[57] ABSTRACT

In a semiconductor manufacturing apparatus, the number of fine particles is counted by a particle monitor 15 mounted to a part of an exhaust pipe 12 for exhausting a gas in a process chamber 4, and an end point detection controller 31 observes the count value in time sequence to detect an end point time of plasma etching or plasma cleaning. Further, in a semiconductor manufacturing apparatus, it is possible to calibrate a detection accuracy of the particle monitor with high accuracy.

7 Claims, 7 Drawing Sheets

SEMICONDUCTOR MANUFACTURING APPARATUS

BACKGROUND OF THE INVENTION

1. Field Of The Invention

The present invention relates to a semiconductor manufacturing apparatus to manufacture a semiconductor integrated circuit, or a semiconductor manufacturing apparatus having a dust generation evaluating apparatus.

2. Description Of The Prior Art

Because of sufficient step coverage or of capable of covering the steps of films superiority, a tungsten (W) film formed by a Chemical Vapor Deposition (CVD) method has been used as a wire or an interconnecting film of a semiconductor manufacturing apparatus.

FIG. 8 is a sectional view typically showing a structure of a conventional tungsten CVD apparatus (semiconductor manufacturing apparatus) disclosed in, for example, Japanese Patent Laid-open publication number: JP-A-6/188193. In the drawing, reference number 1 designates a wafer including a semiconductor such as silicon, 2 denotes a susceptor to support the wafer 1 mounted thereon, and 3 indicates a shadow ring to bring the wafer 1 into tight contact with the susceptor 2, and mask an outer periphery of the wafer 1 at a time of deposition so as to form an undeposited portion. Reference number 4 designates a deposition chamber, 5 denotes a stand-by chamber mounted to deliver the wafer 1 between the deposition chamber 4 and the outside without breaking a vacuum, 6 indicates a wafer carrying robot arm to deliver the wafer 1 between the deposition chamber 4 and the outside, 7 designates a perforated nozzle head with many holes provided in its surface to introduce a gas into the deposition chamber 4, 8 denotes a gas supply system in which the gas is supplied to the perforated nozzle head 7, 9 indicates a wafer cassette in which a predetermined number of wafers 1 are mounted to carry the wafers 1, 10 designates a lamp to heat the susceptor 2, and 11 indicates a lamp window provided in a wall portion of the deposition chamber 4 between the lamp 10 and the susceptor 2.

Reference number 12 designates an exhaust pipe to exhaust the gas in the deposition chamber 4 to outside of the apparatus, 13 denotes an end point detector to detect an end point of plasma cleaning, 14 indicates a window provided in a wall portion of the deposition chamber 4 to which the end point detector 13 is mounted, and 15 is a particle monitor including a laser irradiation system 15*a*, a detector 15*b*, and windows 15*c* and 15*d*. Reference number 16 designates a slit valve mounted to hold airtightness between the deposition chamber 4 and the stand-by chamber 5, and opened when the wafer 1 is carried in or out. Reference number 33 designates an end point detection controller to generates and to output a control signal used to control the completion time of the plasma cleaning based on the end point detection signal for the plasma cleaning detected by the end point detector 13.

Next, a description will now be given of the operation of the conventional tungsten CVD apparatus shown in FIG. 8.

After the wafer cassette 9 is mounted in the stand-by chamber 5, and the stand-by chamber 5 is cut off from outside air, the slit valve 16 is opened to keep the stand-by chamber 5 and the deposition chamber 4 at the same atmospheric pressure. Thereafter, the wafer carrying robot arm 6 is used to take one of the wafers 1 out of the wafer cassette 9, and mount the wafer 1 onto the susceptor 2. Subsequently, the susceptor 2 is moved upward to attach the shadow ring 3 to the outer periphery of the wafer 1. The susceptor 2 is previously heated by radiation heat of the lamp 10 so that the wafer 1 mounted on the susceptor 2 can rapidly reach a predetermined temperature because of heat conduction from the susceptor 2. In this state, a tungsten thin film is formed by spraying a reaction gas on a surface of the wafer 1 through the perforated nozzle head 7. For example, a mixed gas of mono-silane ($SiH_4$) and tungsten hexafluoride ($WF_6$) may be used as the reaction gas. After the tungsten thin film having a predetermined thickness is deposited on the surface of the wafer 1, the wafer carrying robot arm 6 is used to remove the wafer 1 from the susceptor 2 and move the wafer 1 back to the stand-by chamber 5, resulting in the completion of a series of processes.

In the conventional tungsten CVD apparatus shown in FIG. 8, a $WF_6$ gas is thermally decomposed to deposit the tungsten film on hot surfaces of the component parts of the apparatus, such as side surfaces of the shadow ring 3 and the susceptor 2, and an inner wall of the deposition chamber 4 as well as the wafer 1. The plasma cleaning is typically carried out to remove the deposited tungsten film.

In the plasma cleaning process, plasma is generated by introducing an $NF_3$ gas into the deposition chamber 4 immediately after the one wafer 1 is processed, and the plasma etches to remove the tungsten films deposited on the component parts of the apparatus.

Specifically, the $NF_3$ gas is introduced into the deposition chamber 4 through the perforated nozzle head 7, and high-frequency voltage is applied between the perforated nozzle head 7 and the susceptor 2 in order to generate the plasma. The plasma discharge decomposes the $NF_3$ gas to form a F radical (active species), and the F radical reacts with the tungsten to form a volatile tungsten fluoride, thereby etching the tungsten film. The formed tungsten fluoride is discharged external to the deposition chamber 4 through the exhaust pipe 12.

Further, in the conventional tungsten CVD apparatus shown in FIG. 8, the process gas may cause unexpected vapor growth due to a variation in process condition to generate fine particles, or the tungsten film may be peeled off due to poor plasma cleaning to generate fine particles in the apparatus. Adhesion of the fine particles to the wafer 1 causes an abnormal operation of a semiconductor integrated circuit device in the course of manufacture, and a reduction in yield. The particle monitor 15 is used to rapidly detect generation of the fine particles in the apparatus so as to minimize occurrence of product defects. Since the particle monitor 15 can detect fine particles passing through the exhaust pipe 12 according to a stream of the process gas, it is possible to detect the generation of the fine particles in the apparatus. When the particle monitor 15 detects the fine particles to find dust in the apparatus, the process for products is immediately stopped, and the deposition chamber 4 is opened to atmosphere for internal wet cleaning, thereby removing a dust generation source in the apparatus.

The conventional semiconductor manufacturing apparatus such as the conventional tungsten CVD apparatus has the above structure in which the end point detector 13 is used to detect the end point of the plasma cleaning process by detecting a variation in emission of the F radical in the plasma. In this case, the increasing of the number of processed wafers 1 causes that the thickness of the tungsten film deposited on the window 14 of the end point detector 13 becomes thick, so that the windows 14 becomes blur and only insufficient emission from the plasma is incident on the end point detector 13, resulting in a problem in which the end point is defectively detected.

Further, in regard to the particle monitor 15, since the increase in the number of processed wafers 1 increases, for example, thicknesses of the tungsten films deposited on the windows 15c and 15d to cause blur of the windows, resulting in a problem of reduced intensity of lasers with which the particle monitor 15a irradiates the fine particles passing through the exhaust pipe 12, or a reduced rate of detection of scattered lights from the fine particles.

Further, in the conventional semiconductor manufacturing apparatus, the particle monitor 15 is disposed as closely as possible to the deposition chamber 4 so as to enhance the detection accuracy of fine particles. Thus, when the windows 15c and 15d of the particle monitor 15 are blurred, the operation of the apparatus must be stopped to open the deposition chamber 4 to atmosphere for cleaning. As a result, there is a further problem in which an availability factor of the apparatus is reduced because the deposition process can not be performed during the cleaning.

Further, the particle monitor 15 can merely detect the fact that dust is generated in the apparatus, and it is difficult to specify a position of the generated dust. Specifically, since it is impossible to obtain information about where the dust is generated in the apparatus. Hence, for example, if a carrying path of the wafer 1 is deviated from a correct path, a direction of the deviation can not be specified, resulting in a problem in which no measure can be taken.

Further, in the particle monitor 15, the detection accuracy is typically calibrated at atmospheric pressure by using a reference particle generating source. In this case, there is a difference in, for example, refractive index between this state and a state in a vacuum or a low pressure process gas in which the particle monitor 15 is actually used. As a result, there is a still another problem in which it is difficult to calibrate the detection accuracy of the particle monitor 15 under a practical processing condition.

SUMMARY OF THE INVENTION

In order to overcome the drawbacks of the conventional semiconductor manufacturing apparatus, it is an object of the present invention to provide a semiconductor manufacturing apparatus including a dust generation evaluating apparatus in which an end point of etching or plasma cleaning can stably be detected without a reduction in accuracy over a long period of time.

According to a preferred embodiment of the present invention, for achieving the above-mentioned object, a semiconductor manufacturing apparatus is an etching apparatus or a deposition apparatus having a process chamber in which a semiconductor wafer is accommodated, for etching a thin film deposited on the semiconductor wafer by using plasma, or depositing a thin film on the semiconductor wafer. The etching apparatus covers a plasma etching process, and the deposition apparatus covers plasma cleaning in which a deposit adhered to the inside of the process chamber is cleaned by plasma. In the semiconductor manufacturing apparatus of the present invention, a particle monitor is mounted to an exhaust pipe to exhaust a gas in the process chamber to count the number of particles generated at the time of plasma etching or plasma cleaning, and an end point detection controller observes the count value in time sequence to detect an end point of the plasma etching or the plasma cleaning, thereby terminating the plasma etching or the plasma cleaning.

Further, in the semiconductor manufacturing apparatus, an isolation valve is mounted to an exhaust pipe extending between a process chamber and a particle monitor to isolate the process chamber from the particle monitor.

Further, in the semiconductor manufacturing apparatus, a gate valve or a ball valve is used as the isolation valve.

Further, in the semiconductor manufacturing apparatus, a plurality of exhaust pipes are mounted to the process chamber, particle monitors are respectively disposed at the exhaust pipes, and a signal processor is mounted to perform a calculation to find a dust position depending upon dust time detection signals transmitted from the plurality of particle monitors.

Further, the semiconductor manufacturing apparatus further includes a dust generation evaluating apparatus including a magnetic member with a surface to which a blast process is made by a blast material having a predetermined particle diameter, and member deforming means for deforming the member to discharge a residual blast material. The dust generation evaluating apparatus is used to calibrate a detection accuracy of the particle monitor with high accuracy.

Further, in the dust generation evaluating apparatus of the semiconductor manufacturing apparatus, the magnetic member with the surface to which the blast process is made is made of stainless, and the member deforming means include a supporting pedestal to support a magnetic stainless plate in a cantilever beam manner, and an electromagnet to attract and repulse a free end of the stainless plate.

Further, in the semiconductor manufacturing apparatus, at least one dust generation evaluating apparatus is disposed in the process chamber, the dust generation evaluating apparatus is operated in a vacuum or in an atmosphere of a predetermined process gas in order to generate many particles, and the particle monitors measures a flying speed of the many particles by detecting the many particles based on the dust generation detection time signal, and calibrates a flying speed of the many particles during an actual process based on the obtained flying time of the many particles.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

A description will now be given of one embodiment of a semiconductor manufacturing apparatus having a dust generation evaluating apparatus according to the present invention referring to the accompanying drawings.

First embodiment

Figure 1:
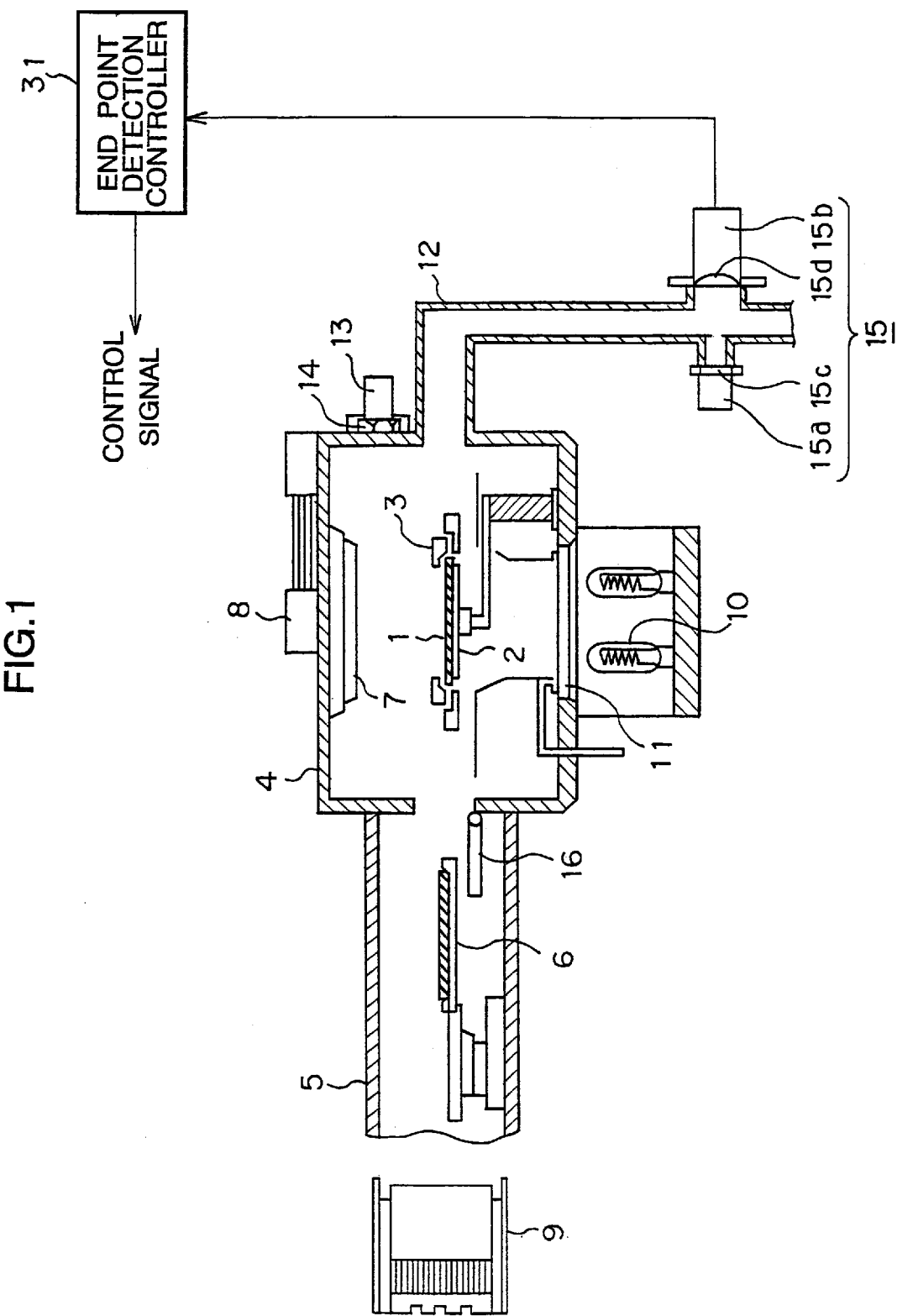
FIG. 1 is a diagram showing a structure of a CVD apparatus serving as a semiconductor manufacturing apparatus according to the first embodiment of the present invention.

FIG. 1 is a diagram showing a structure of a semiconductor manufacturing apparatus according to the first embodiment of the present invention, and illustrating the present invention applied to a CVD apparatus. In the drawing, reference number 1 designates a wafer including a semiconductor such as silicon, 2 denotes a susceptor to support the wafer 1 mounted thereon, and 3 indicates a shadow ring to bring the wafer 1 into tight contact with the susceptor 2, and mask an outer periphery of the wafer 1 at a time of deposition so as to form an undeposited portion. Reference number 4 designates a deposition chamber (a process chamber), 5 denotes a stand-by chamber mounted to deliver the wafer 1 while holding the predetermined degree of vacuum between the deposition chamber 4 and the outside, 6 indicates a wafer carrying robot arm to deliver the wafer 1 between the deposition chamber 4 and the outside, and 7 designates a perforated nozzle head having many holes provided in its surface to introduce a gas into the deposition chamber 4, used to spray the reaction gas onto an entire surface of the wafer 1.

Reference number 8 designates a gas supply system in which the gas is supplied from a gas supply source (not shown) to the perforated nozzle head 7, 9 is a wafer cassette in which a predetermined number of wafers 1 are carryably accommodated, 10 is a lamp to heat the susceptor 2, and 11 indicates a lamp window provided in a wall portion of the deposition chamber 4 between the lamp 10 and the susceptor 2. Reference number 12 designates an exhaust pipe to exhaust the gas in the deposition chamber 4 external to the apparatus, 13 denotes an end point detector to detect an end point of deposition, 14 indicates a window provided in a wall portion of the deposition chamber 4 to which the end point detector 13 is mounted, and 15 designates a particle monitor including a laser irradiation system 15a, a detector 15b, and windows 15c and 15d.

Reference number 16 means a slit valve mounted to hold airtightness between the deposition chamber 4 and the standby chamber 5, and opened when the wafer 1 is carried in or out. Reference number 31 means an end point detection controller to take as input a fine particle counted-value signal counted and then transferred from the particle monitor 15 so as to detect an end point of plasma cleaning, and output a control signal to each section of the apparatus depending upon the result of detection.

Next, a description will be given of the operation of the semiconductor manufacturing apparatus according to the first embodiment shown in FIG. 1.

After the wafer cassette 9 is mounted to the stand-by chamber 5, and the stand-by chamber 5 is cut off from outside air, the slit valve 16 is opened to keep the stand-by chamber 5 and the deposition chamber 4 at the same atmospheric pressure.

The deposition chamber 4 is evacuated by an unillustrated evacuator such as a mechanical booster pump to a pressure of about 10 m Torr (approximately 1 Pa). Subsequently, the wafer carrying robot arm 6 is used to take the one wafer 1 out of the wafer cassette 9, and mount the wafer 1 onto the susceptor 2. Thereafter, the susceptor 2 is moved upward to attach the shadow ring 3 to the outer periphery of the wafer 1.

The susceptor 2 is previously heated by radiation heat of the lamp 10 so that the wafer 1 mounted onto the susceptor 2 can rapidly reach a predetermined temperature (ranging from 400° to 500° C.) because of heat conduction from the susceptor 2. In this state, a tungsten thin film is deposited by spraying the reaction gas on a surface of the wafer 1 through the perforated nozzle head 7.

A tungsten deposition process will specifically be illustrated by way of a case where a contact hole in the wafer 1 is plugged up with tungsten (W) as an example.

First, in order to form a nucleus of the tungsten (W) on the wafer 1, a gas obtained by mixing a mono-silane gas ($SiH_4$) and a tungsten hexafluoride ($WF_6$) gas in a ratio of 1:3 is supplied onto the wafer 1 for a time period of 30 to 100 seconds by using argon (Ar) as a carrier gas. Next, a gas having sufficient step coverage such as a gas obtained by mixing a tungsten hexafluoride ($WF_6$) gas and hydrogen ($H_2$) in a ratio of 1:5 is supplied onto the wafer 1 for a time period of 50 to 200 seconds. The process deposits a tungsten film having an excellent plugging performance and a thickness of about 0.5 to 1.0 um. After the completion of deposition, the wafer carrying robot arm 6 is used to remove the wafer 1 from the susceptor 2 and move the wafer 1 back to the stand-by chamber 5, resulting in the completion of a series of tungsten (W) deposition processes.

Like the conventional semiconductor manufacturing apparatus mentioned earlier, in the tungsten CVD apparatus according to the first embodiment, the $WF_6$ gas is thermally decomposed to deposit the tungsten film on hot surfaces of component parts of the apparatus, such as a surface of the shadow ring 3, a side surface of the susceptor 2, and an inner wall of the deposition chamber 4 as well as a surface of the wafer 1.

The tungsten films deposited on the component parts may interfere with the next tungsten deposition process so that the tungsten films should be removed. For this purpose, the plasma cleaning is typically carried out.

In the plasma cleaning process, plasma is generated by introducing a nitrogen trifluoride ($NF_3$) gas into the deposition chamber 4 immediately after the one wafer 1 is processed, and the plasma etches to remove the tungsten films deposited on the surfaces of the component parts of the apparatus. Specifically, the $NF_3$ gas is introduced into the deposition chamber 4 through the perforated nozzle head 7, and a high-frequency voltage is applied between the perforated nozzle head 7 and the susceptor 2, thereby generating the plasma. The plasma discharge decomposes the $NF_3$ gas to form F radicals (active species), and the F radicals react with the tungsten to form a volatile tungsten fluoride, thereby etching the tungsten film. The generated tungsten fluoride is transmitted to outside of the deposition chamber 4 through the exhaust pipe 12 in order to exhaust it.

In the semiconductor manufacturing apparatus according to the first embodiment, the end point detection controller 31 observes a count value of fine particles counted by the particle monitor 15 in time sequence, thereby detecting the end point of the plasma cleaning process.

Figure 2:
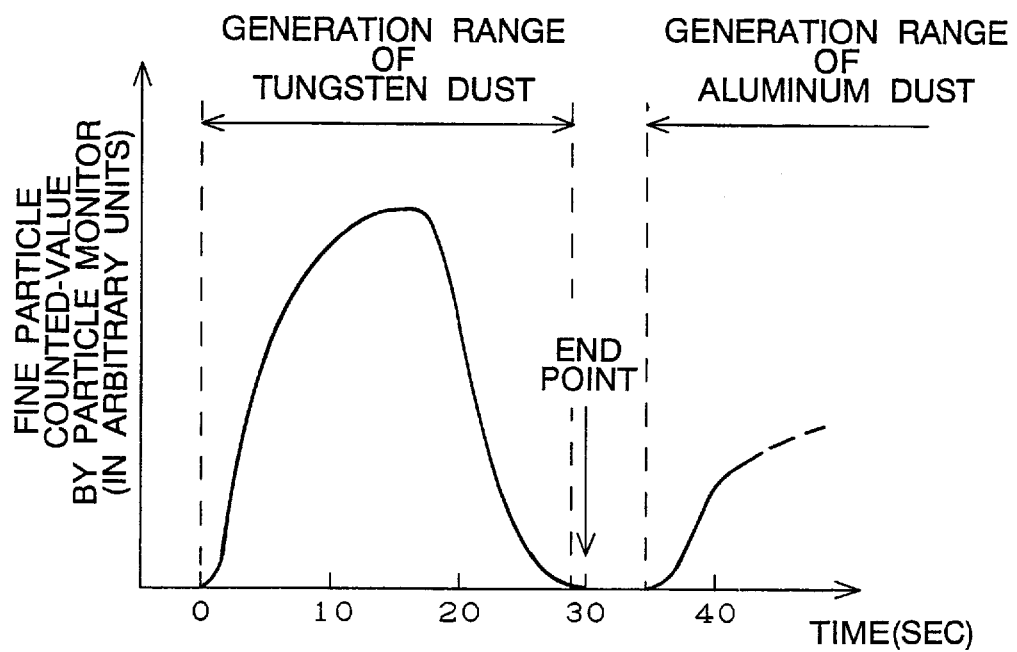
FIG. 2 is a graph diagram showing illustrative observation of a count value of fine particles measured by a particle monitor 15 at a time of plasma cleaning in the semiconductor manufacturing apparatus shown in FIG. 1.

FIG. 2 is a graph diagram showing illustrative observation of the counted-value of the fine particles measured by the particle monitor 15 during the plasma cleaning.

In the drawing, the lateral axis defines an elapsed time (in seconds) with a time point where the generation of the tungsten-dust is observed as a starting point, and the ordinate axis defines the fine particle counted value (in optional unit) in the particle monitor 15.

As can be seen from FIG. 2, while there are residual tungsten films on the inner wall of the deposition chamber 4 and other component parts in an initial period of the plasma cleaning, fine particles of tungsten are generated together with the volatile tungsten fluoride. It is thereby possible to observe the generation of tungsten-dust. The amount of the generated tungsten-dust is gradually increased immediately after a start of the plasma cleaning process, and the amount reaches its peak after the elapse of a certain time, thereafter beginning to decrease.

As a result, no tungsten-dust can be observed at a certain time point. This is because no tungsten fine-particles (no generation of the tungsten-dust) are generated by completely removing the tungsten film deposited on, for example, the inner wall of the deposition chamber 4. When the plasma cleaning is thereafter continued, fine particles of material of which the deposition chamber 4 is made such as aluminum ceramics are generated (the generation of aluminum-dust).

In the semiconductor manufacturing apparatus according to the first embodiment, the end point detection controller 31 observes the time-varying amount of the generation of dust during the plasma cleaning, counted by the particle monitor 15, and decides that the end point is a time point when the first dust generation is finished (for example, after 30 seconds counted from the generation of dust in the first embodiment shown in FIG. 1), that is, a time point where no tungsten fine particle (no generation of tungsten-dust) is generated.

After the decision of the end point, the end point detection controller 31 outputs a control signal to terminate the plasma cleaning process in the deposition chamber 4.

In the semiconductor manufacturing apparatus according to the first embodiment, the count value of fine particles measured by the particle monitor 15 is used to detect the end point of the plasma cleaning.

This provides the following effect. That is, since the particle monitor 15 is mounted to a part of the exhaust pipe 12a, positioned apart from heat generating portions such as the susceptor 2, an increase in temperature of the particle monitor 15 can be reduced, and the windows 15c and 15d can not easily be blurred. As a result, the particle monitor 15 can normally be operated over a long time period so that the end point of the plasma cleaning process can accurately be detected.

Thus, it is possible to stably detect the end point of the plasma cleaning process while keeping high accuracy over a long time period. It is thereby possible to extend a maintenance period of the semiconductor manufacturing apparatus, and to enhance an availability factor of the semiconductor manufacturing apparatus.

In the semiconductor manufacturing apparatus according to the first embodiment, a description has been given of a case where the present invention is applied to the plasma cleaning in the tungsten CVD apparatus. However, it must be noted that the present invention should not be limited to this, and may be applied to all process apparatus to, for example, etch or clean by generating the plasma. For example, the present invention can be applied to a deposition apparatus to deposit a silicon oxide film, a silicon nitride film, a polysilicon film, a tungsten silicide film, an aluminum film, and a tungsten film, and to a plasma etching apparatus for these films.

Second embodiment

Figure 3:
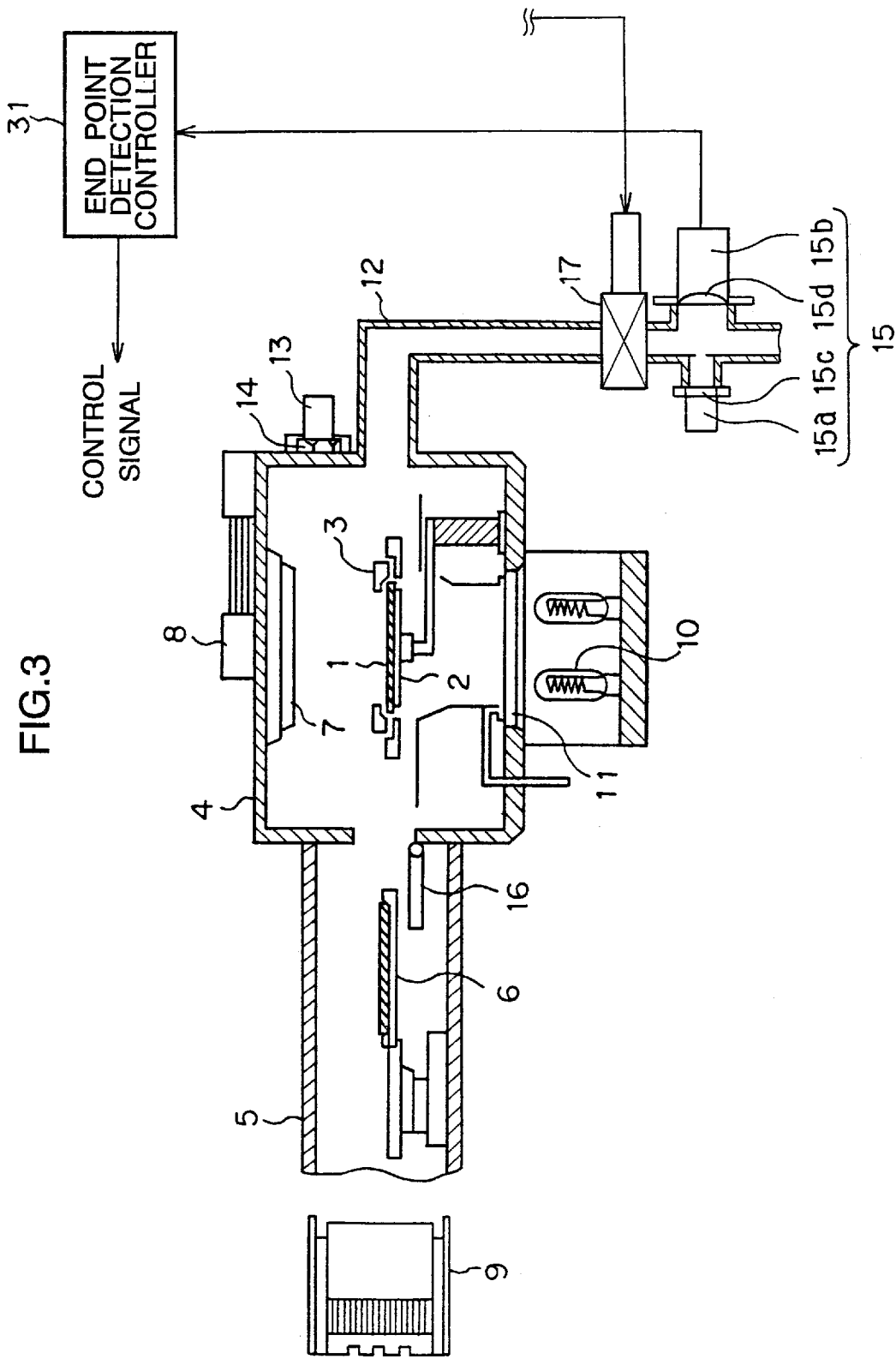
FIG. 3 is a diagram showing a structure of a CVD apparatus serving as a semiconductor manufacturing apparatus according to the second embodiment of the present invention.

FIG. 3 is a diagram showing a structure of a semiconductor manufacturing apparatus according to the second embodiment of the present invention, and illustrating the present invention applied to a CVD apparatus. In the drawing, a wafer 1, a susceptor 2, a shadow ring 3, a deposition chamber 4, a stand-by chamber 5, a wafer carrying robot arm 6, a perforated nozzle head 7, a gas supply system 8, a wafer cassette 9, a lamp 10, a lamp window 11, an exhaust pipe 12, an end point detector 13, a window 14, a particle monitor 15, a laser irradiation system 15a, a detector 15b, windows 15c and 15d, a slit valve 16, and an end point detection controller 31 are identical with the component parts of the semiconductor manufacturing apparatus according to the first embodiment shown in FIG. 1, and descriptions thereof are omitted.

In the tungsten CVD apparatus according to the second embodiment, an isolation valve 17 is mounted to a part of the exhaust pipe 12 in addition to the structure of the tungsten CVD apparatus according to the first embodiment. That is, the isolation valve 17 is mounted to the part of the exhaust pipe 12 between the deposition chamber 4 and the particle monitor 15, and is operated for vacuum isolation between the deposition chamber 4 and the particle monitor 15.

Since the isolation valve 17 preferably has a structure in which no interference is caused with passage of fine particles flying through the exhaust pipe 12 from the deposition chamber 4, as the isolation valve 17 is used a gate valve, a ball valve, or the like.

A description will now be given of the operation of FIG. 3.

Though the windows 15c and 15d of the particle monitor 15 can not easily be blurred in general, it is necessary to periodically clean the windows 15c and 15d in order to hold an optimal state of the semiconductor manufacturing apparatus. The windows 15c and 15d of the particle monitor 15 are cleaned with the deposition chamber 4 kept under vacuum by closing the isolation valve 17 to isolate the deposition chamber 4 from the particle monitor 15. Thus, since the inside of the deposition chamber 4 is not exposed to the atmosphere, it is possible to rapidly continue the tungsten deposition process by opening the isolation valve 17 after the completion of cleaning of the windows 15c and 15d of the particle monitor 15.

Further, when the deposition chamber 4 is opened to atmosphere for maintenance, and the windows 15c and 15d of the particle monitor 15 are not heavily blurred, the isolation valve 17 is closed to evacuate the particle monitor 15. The operation can reduce oxidation of deposits on the windows 15c and 15d so that no cleaning is required for the windows 15c and 15d of the particle monitor 15 at a time of maintenance of the deposition chamber 4.

As set forth above, in the semiconductor manufacturing apparatus according to the second embodiment, the isolation valve 17 is mounted between the deposition chamber 4 and the particle monitor 15 so that the deposition chamber 4 can be kept under vacuum even during the maintenance of the particle monitor 15. As a result, it is possible to instantly start up the apparatus after the completion of maintenance so as to minimize a reduction in availability factor of the apparatus due to the maintenance of the particle monitor 15. Further, since it is possible to reduce the number of times the semiconductor manufacturing apparatus is cleaned, the availability factor of the semiconductor manufacturing apparatus can be enhanced.

Third embodiment

Figure 4:
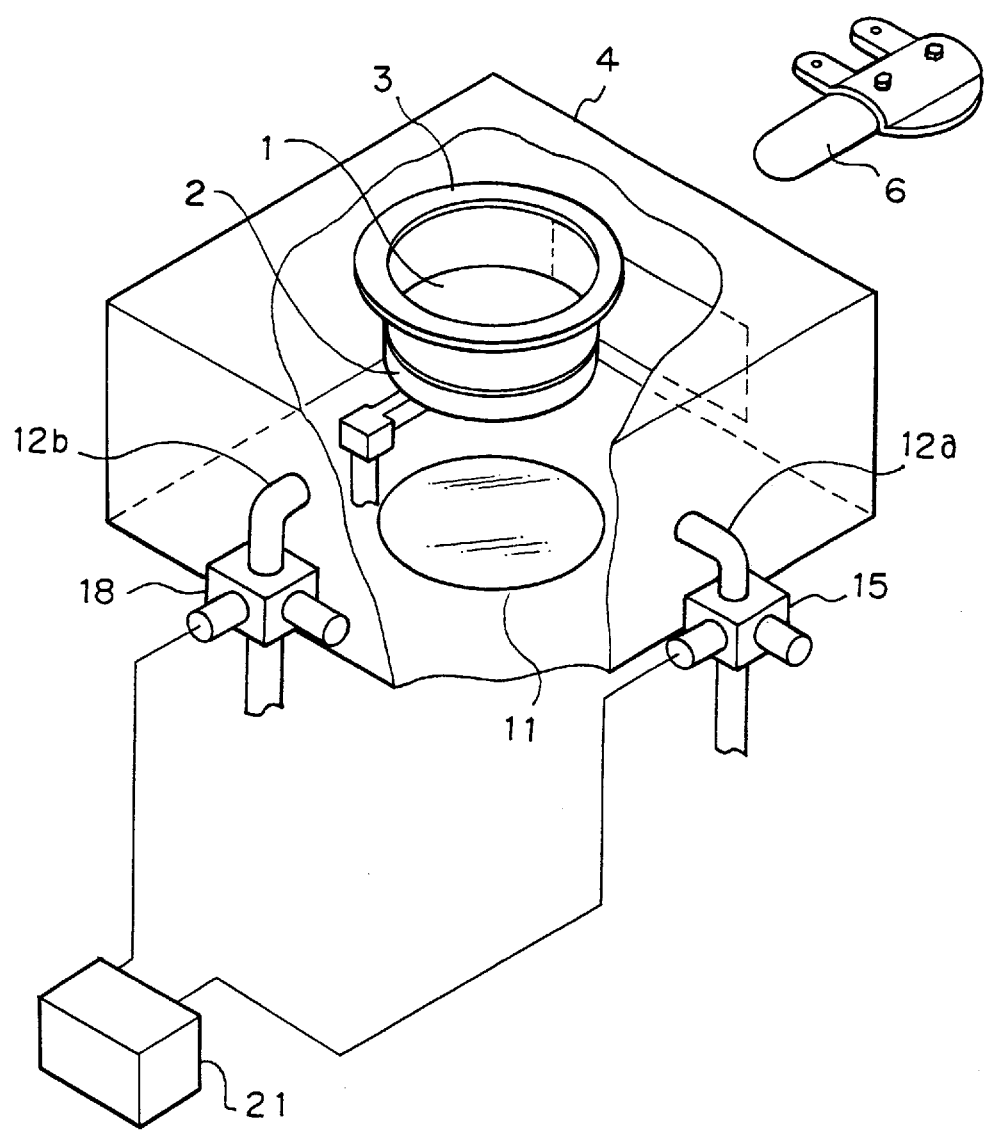
FIG. 4 is an exploded perspective view mainly showing a deposition chamber and a plurality of exhaust pipes serving as essential parts of a CVD apparatus as a semiconductor manufacturing apparatus according to the third embodiment of the present invention.

FIG. 4 is an exploded perspective view showing an structure of essential parts of a CVD apparatus serving as a semiconductor manufacturing apparatus according to the third embodiment of the present invention. In the drawing, reference number 1 designates a wafer, 2 denotes a susceptor, 3 indicates a shadow ring, 4 designates a deposition chamber, 6 denotes a wafer carrying robot arm, 11 indicates a lamp window, 12a and 12b designate exhaust pipes, and 15 and 18 indicate particle monitors. The component parts are identical with those of the semiconductor manufacturing apparatus according to the first embodiment shown in FIG. 1, and detailed descriptions are omitted.

In the CVD apparatus according to the third embodiment, the plurality of exhaust pipes 12a and 12b are mounted to the deposition chamber 4, and the particle monitors 15 and 18 are respectively mounted to the exhaust pipes 12a and 12b.

As shown in FIG. 4, in the semiconductor manufacturing apparatus according to the third embodiment, the two exhaust pipes 12a and 12b are mounted to the deposition chamber 4, and the particle monitors 15 and 18 are respectively mounted to the exhaust pipes 12a and 12b. Further, the CVD apparatus is provided with a signal processor 21 to receive and to process dust generation signals corresponding to the number of fine particles counted by the particle monitors 15 and 18 so as to perform a calculation to find a position where dust is generated in the deposition chamber 4.

A description will now be given of the operation of the semiconductor manufacturing apparatus according to the third embodiment.

Figure 5:
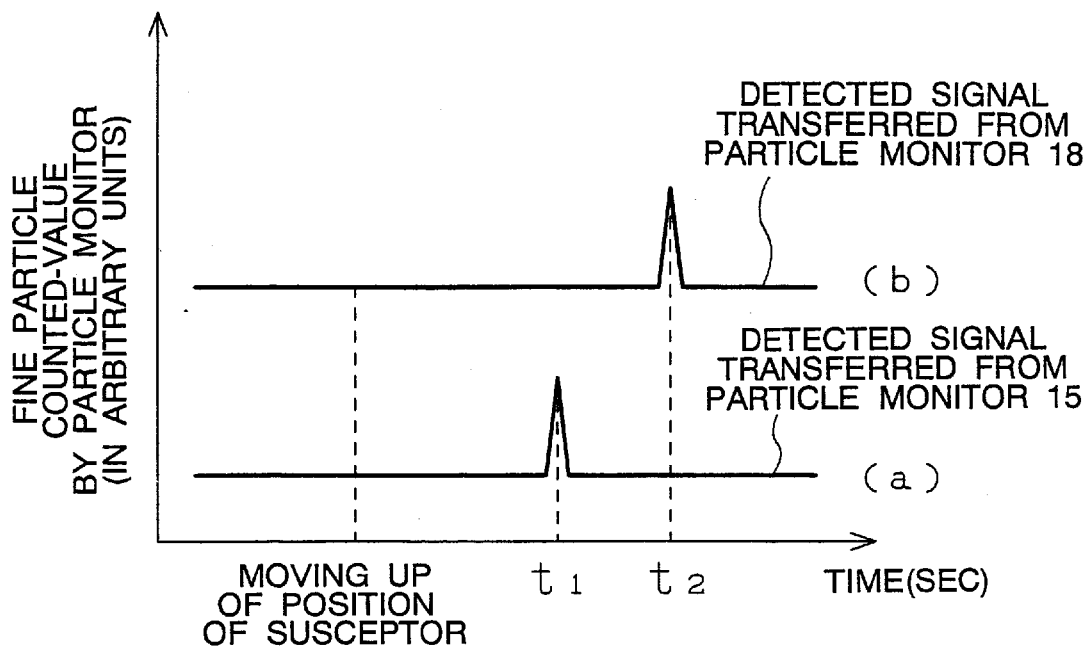
FIG. 5 is a diagram showing a detected signal (a) transferred from a particle monitor 15 and a detected signal (b) transferred from a particle monitor 18 in the semiconductor manufacturing apparatus shown in FIG. 4.

If any deviation is caused when the wafer 1 is mounted onto the susceptor 2 by using the wafer carrying robot arm 6, the wafer 1 and the shadow ring 3 are brought into contact with each other when the susceptor 2 is moved upward to attach the shadow ring 3 to the wafer 1, resulting in a dust generation. Fine particles generated by the dust generation are exhausted according to a stream of a process gas. Since the process gas has a constant flow rate, it can be considered that the above fine particles have a substantially constant flying speed "v". As shown in FIG. 5, on the basis of a time at which the susceptor 2 is moved upward, it is possible to find times $t_1$ and $t_2$ at which the fine particles generated by the contact between the wafer 1 and the shadow ring 3 when the susceptor 2 is moved upward fly to the two particle monitors 15 and 18.

Figure 6:
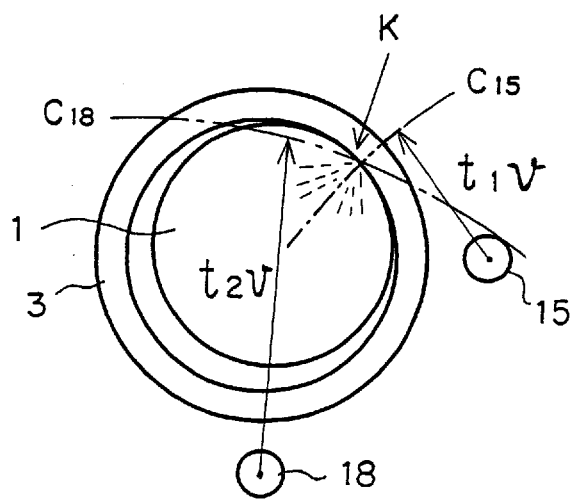
FIG. 6 is an explanatory view showing illustrative calculation to find a point of intersection K of a circle $C_{15}$ of a radius of $t_1v$, with center at a position where the particle monitor 15 is mounted in the semiconductor manufacturing apparatus shown in FIG. 4, and a circle $C_{18}$ of a radius of $t_2v$, with center at a position where the particle monitor 18 is mounted.

A detected signal (a) from the particle monitor 15 and a detected signal (b) from the particle monitor 18 shown in FIG. 5 are transferred to the signal processor 21. The signal processor 21 takes as inputs the detected signals (a) and (b), and performs calculation to find a point K of intersection of a circle $C_{15}$ of a radius of $t_1v$, with center at a position where the particle monitor 15 is mounted, and a circle $C_{18}$ of a radius of $t_2v$, with center at a position where the particle monitor 18 is mounted, thereby specifying the position where the dust is generated as shown in FIG. 6. When the position K where the dust is generated is specified, a control section (not shown) of the apparatus corrects a position where the wafer carrying robot arm 6 delivers the wafer 1 in order to avoid the dust generation by overcoming the contact between the wafer 1 and the shadow ring 3. Since the above series of dust generation overcoming operations can be carried out without breaking the vacuum of the deposition chamber 4, it is possible to enhance an availability factor of the apparatus.

As set forth above, in the semiconductor manufacturing apparatus according to the third embodiment, the plurality of particle monitors 15 and 18, and the signal processor 21 are used to specify the position at which dust is generated depending upon a difference in dust generation detection time detected by the particle monitors 15 and 18 when the abrupt contact dust generation occurs at the time of delivery of the wafer 1. Depending upon the specified position, the contact due to the delivery of the wafer 1 can be overcome without breaking the vacuum of the deposition chamber 4. As a result, it is possible to significantly enhance the availability factor of the semiconductor manufacturing apparatus.

Fourth Embodiment

Figure 7:
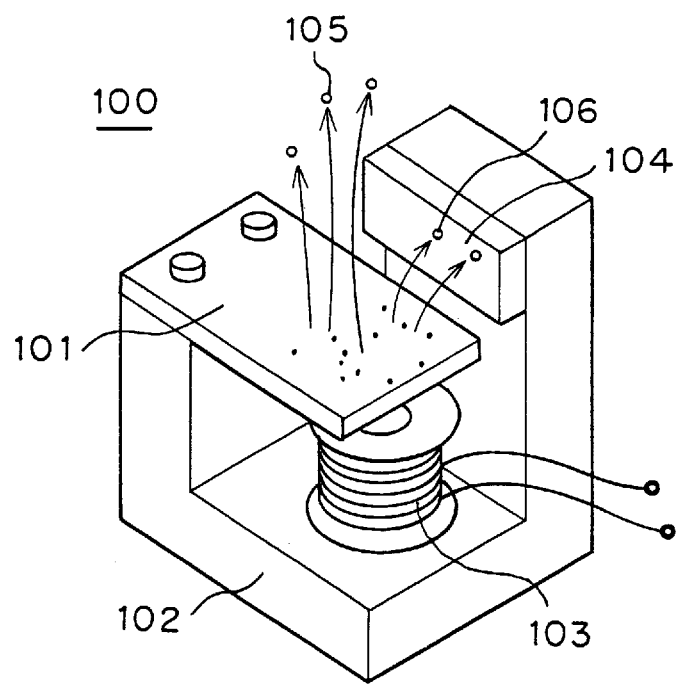
FIG. 7 is a diagram mainly showing a structure of a dust generation evaluating apparatus incorporated in a semiconductor manufacturing apparatus according to the fourth embodiment of the present invention.
Figure 8:
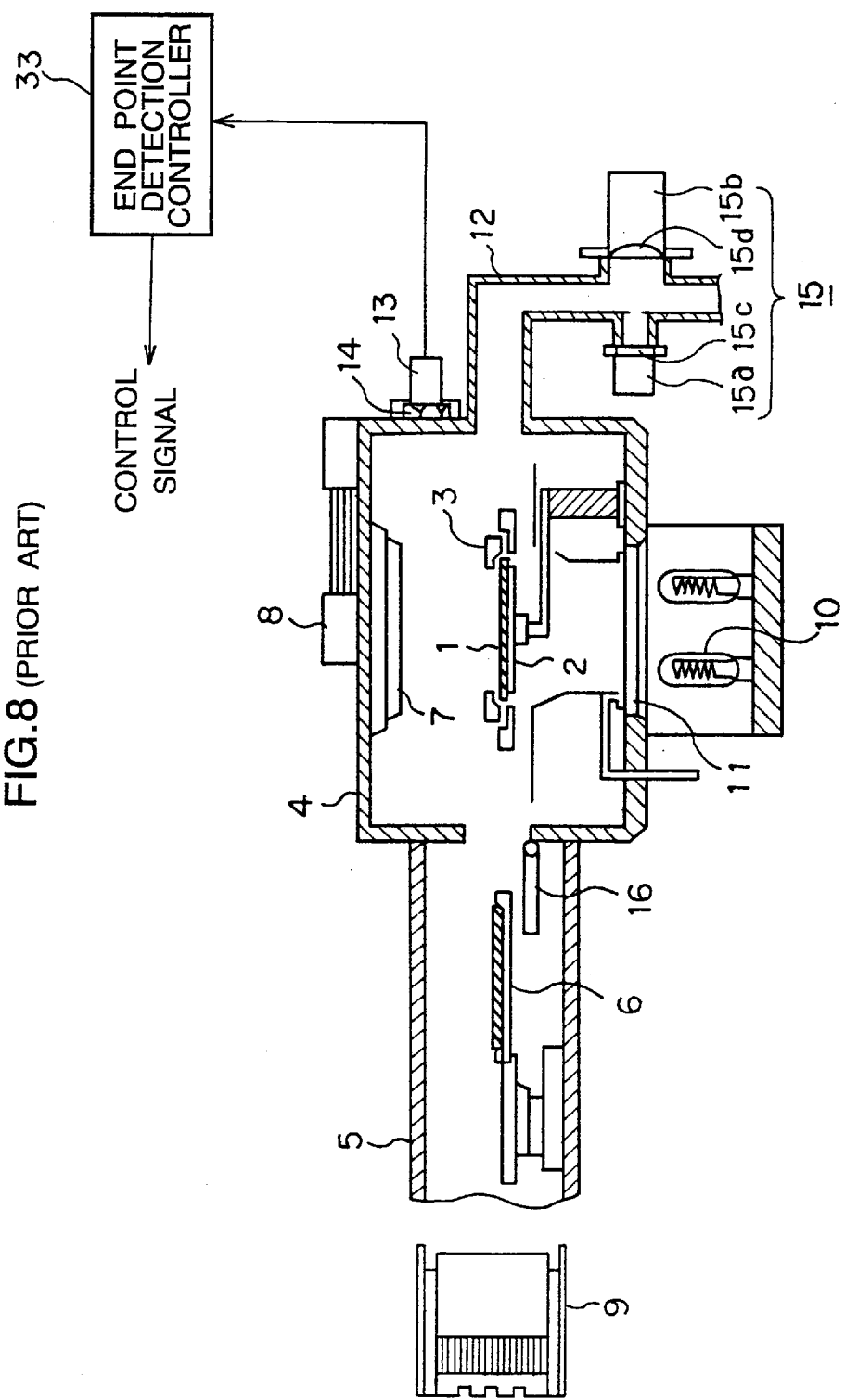
FIG. 8 is a sectional view showing a structure of a conventional tungsten CVD apparatus.

FIG. 7 is a diagram mainly showing a structure of a dust generation evaluating apparatus in a semiconductor manufacturing apparatus having the dust generation evaluating apparatus according to the fourth embodiment of the present invention. In the drawing, reference number 100 designates the dust generation evaluating apparatus, 101 denotes a magnetic stainless plate (magnetic member) to which a blast process is made by using a blast material, 102 indicates a supporting pedestal (member deforming means) to support the magnetic stainless plate 101 in a cantilever beam manner, 103 indicates an electromagnet (member deforming means), 104 is a permanent magnet, 105 designates a residual blast material, and 106 indicates a stainless powder.

In the semiconductor manufacturing apparatus according to the fourth embodiment, the dust generation evaluating apparatus 100 is used as a fine particle generating source mounted in the chamber 4 in the semiconductor manufacturing apparatus according to the first, second and third. embodiments shown in FIGS. 1, 3, and 4 to generate fine particles detected by particle monitors 15 and 18 when detection accuracy of the particle monitors 15 and 18 is calibrated.

A description will now be given of the operation of the semiconductor manufacturing apparatus having the dust generation evaluating apparatus 100 according to the fourth embodiment.

Intermittent current is applied from a power source (not shown) to the electromagnetic 103 mounted in the dust generation evaluating apparatus 100 shown in FIG. 7, thereby generating an intermittent magnetic force.

The generating magnetic force causes attraction and repulsion to deform a free end of the magnetic stainless plate 101 supported in the cantilever beam manner. Thus, the residual blast material 105 is discharged from a surface of the magnetic stainless plate 101.

A particle diameter of the residual blast material 105 is predetermined by a particle diameter of the blast material used in the blast process. A blast material having a particle diameter in the range of about 1 to 20 $\mu$m can be used as the residual blast material 105. Therefore, the residual blast material 105 discharged from the surface of the magnetic stainless plate 101 can have a substantially uniform particle diameter in the range of about 1 to 20 $\mu$m.

On the other hand, since the concurrently discharged stainless powders 106 have nonuniform particle diameters, the stainless powders 106 are adsorbed and removed by the permanent magnet 104.

When the dust generation evaluating apparatus 100 shown in FIG. 7 is mounted in, for example, the deposition chamber 4 of the semiconductor manufacturing apparatus according to the first embodiment shown in FIG. 1, and a pulse current with a predetermined frequency is applied to the electromagnet 103, the predetermined number of residual blast materials 105 having a uniform particle diameter are discharged within a unit time from the surface of the magnetic stainless plate 101.

When the residual blast materials 105 are exhausted external to the semiconductor manufacturing apparatus through the exhaust pipe 12, the residual blast materials 105 pass through the particle monitor 15 or 18. Then, the particle monitor 15 or 18 counts the number of residual blast materials 105 passing through them per unit time.

Sensitivity of the particle monitor 15 is adjusted such that the count value falls in a predetermined range, thereby calibrating the detection accuracy of the particle monitor 15.

As set forth above, in the semiconductor manufacturing apparatus having the dust generation evaluating apparatus 100 according to the fourth embodiment, the detection accuracy of the particle monitors 15 and 18 can be calibrated by the dust generation evaluating apparatus 100 in a vacuum or a low pressure process gas. Thus, it is possible to generate a particle having a predetermined particle diameter in a normal using environment and depending upon optional timing. It is thereby possible to calibrate the detection accuracy of the particle monitor with high accuracy.

Further, in the semiconductor manufacturing apparatus having the dust generation evaluating apparatus according to the fourth embodiment, the invention has been described with respect to the stainless used as the material to which the blast process is made in view of corrosion prevention, corrosion resistance to a process gas, and so forth. However, the same effect can be provided by using another magnetic material having high corrosion resistance such as ferrite.

Fifth embodiment

In the semiconductor manufacturing apparatus according to the third embodiment, the description has been given of the operation in which the detection accuracy of the particle monitors 15 and 18 is calibrated on the assumption that the flying speed v of the fine particle is identical with the flow rate of the process gas. However, a difference may be caused between the flying speed v of the fine particle and the flow rate of the process gas according to a shape of a deposition chamber 4, or a particle diameter of the fine particle.

For example, when exhaust pipes 12a and 12b extend to, have complicatedly bent paths from a position where the fine particles generate to the particle monitors 15 and 18 in a CVD apparatus serving as the semiconductor manufacturing apparatus, the fine particles, for example, collide with wall surfaces of bent portions of the exhaust pipes 12a and 12b, and are carried with alternate acceleration and deceleration. Therefore, in this case, there is the difference between the flying speed of the fine particle and the flow rate of the process gas. Further, when the fine particle has a large particle diameter of several hundreds microns, it is impossible to neglect an effect of gravity on the flying speed of the fine, article as well as an effect of force applied from the process gas. Hence, if there is the difference between the flying speed of the fine particle and the flow rate of the process gas in the exhaust pipes 12a and 12b, it is difficult to calculate a flying time of the fine particle in an actual manufacturing process depending upon a geometric dimension of a flying path of the fine particle and the flow rate of the process gas in the semiconductor manufacturing apparatus. In such a case, in the semiconductor manufacturing apparatus, the fine particle is intentionally generated to reproduce and observe an actual flying state of the fine particle, that is, measure a flying time from the position where the fine particles generate to the particle monitor. It is thereby possible to accurately estimate the flying time of the fine particle passing through the exhaust pipes a and 12b from the deposition chamber 4 in actuality.

Specifically, the flying time of the fine particle passing through the exhaust pipes in the semiconductor manufacturing apparatus can be estimated according to the following method.

First, in the semiconductor manufacturing apparatus with the plurality of particle monitors mounted in the deposition chamber such as the semiconductor manufacturing apparatus according to the third embodiment, including the plurality of particle monitors 15 and 18 shown in FIG. 4, a reference particle generating source serving as the dust generation evaluating apparatus 100 used in the fourth embodiment shorn in FIG. 7 is disposed at a position where contact dust generation easily occurs, for example, a position corresponding to an inner periphery of the shadow ring 3. Subsequently, pulse is supplied to the dust generation evaluating apparatus 100 serving as the reference particle generating source, thereby operating the dust generation evaluating apparatus 100 in a pulse manner for only a period of, for example, 10 msec.

Next, times where the particle monitors 15 and 18 respectively observe the fine particles are evaluated according to a time where the fine particles are generated. The plurality of particle monitors 15 and 18 observe the fine particles serving as the dust, resulting in generating dust generation detection time signals. It is thereby possible to find, in an actual process, a difference between a dust generating time at the position where the dust generation evaluating apparatus 100 is disposed, and output times of the dust generation detection time signals.

In the above calibration process of the flying speed of the fine particles serving as the dust generation, an accuracy with which the position of the dust generation is specified can be enhanced. For this purpose, when an annular-type shadow ring is used, it is necessary to measure the flying speed of the fine particle with some positions where the dust generation evaluating apparatus 100, that is, the reference particle generating source is disposed (at least six positions, preferably ten positions or more) so as to previously create a map showing the dust generating positions and the difference in detection time between the dust-detection time signals obtained by the particle monitors 15 and 18. As set forth above, by observing the generating fine particles by the plurality of particle monitors 15 and 18, it is possible to correct the flying speed "v" of the generated dust, and specify the accurate position where the dust is generated. Thus, it is possible to provide a higher accuracy of the detection operation in which the position where the dust is unexpectedly generated is specified.

As set forth above in detail, according to the present invention, the particle monitor mounted to the exhaust pipe to exhaust the gas in the process chamber counts the number of particles generated at the time of plasma etching or plasma cleaning, and the end point detection controller observes the count value in time sequence, thereby detecting the end point time of the plasma etching in the etching apparatus serving as the semiconductor manufacturing apparatus, or the plasma cleaning in the deposition apparatus. It is thereby possible to stably detect the end point of the plasma cleaning over a long time period, and extend the maintenance period of the semiconductor manufacturing apparatus, resulting in an effect of an enhanced availability factor of the semiconductor manufacturing apparatus.

Further, in the semiconductor manufacturing apparatus according to the present invention, the isolation valve is mounted to the exhaust pipe extending between the process chamber and the particle monitor to isolate the process chamber from the particle monitor. It is thereby possible to hold a vacuum of the process chamber even during maintenance of the particle monitor. As a result, since the apparatus can immediately be started up after the completion of maintenance, there is an effect in which it is possible to minimize a reduction in availability factor of the semiconductor manufacturing apparatus due to the maintenance of the particle monitor.

Further, in the semiconductor manufacturing apparatus according to the present invention, the gate valve or the ball valve is used as the isolation valve, resulting in an effect in which no interference is caused with the flight of the fine particle from the process chamber.

Further, in the semiconductor manufacturing apparatus according to the present invention, the plurality of exhaust pipes are mounted in the process chamber, the particle monitors are mounted to the exhaust pipes, and the signal processor is mounted to perform the calculation to find the position of dust generation depending upon the dust generation time detection signals from the plurality of particle monitors. Then, when the abrupt contact dust generation occurs at the time of delivery of the wafer, it is possible to specify the position at which dust is generated based on the difference between the dust detection times detected by the plurality of particle monitors. Depending upon the result of the specified the position at which dust is generated, the contact due to the delivery of the wafer can be overcome without breaking the vacuum of the process chamber. As a result, there is an effect in which it is possible to significantly enhance the availability factor of the semiconductor manufacturing apparatus.

Further, in the semiconductor manufacturing apparatus according to the present invention, in the process chamber is disposed the dust generation evaluating apparatus including the magnetic member with the surface to which the blast process is made by the blast material having the predetermined particle diameter, and the member deforming means for deforming the member to discharge the residual blast material. By operating the dust generation evaluating apparatus in the vacuum or the low-pressure process gas, it is possible to generate the particle having the predetermined particle diameter in the practical using environment and according to the optional timing. Hence, there is an effect in which the detection accuracy of the particle monitor can be calibrated with high accuracy.

Further, in the dust generation evaluating apparatus of the semiconductor manufacturing apparatus according to the present invention, the stainless is used as the magnetic material with the surface to which blast process is made, and the member deforming means includes the supporting pedestal to support the magnetic stainless plate in the cantilever beam manner, and the electromagnet to attract and repulse the free end of the stainless plate. As a result, there is an effect in which the semiconductor manufacturing apparatus can be realized to include the dust generation evaluating apparatus having a more practical and simple structure.

Further, in the semiconductor manufacturing apparatus according to the present invention, the at least one dust generation evaluating apparatus is disposed in the process chamber, and the dust generation evaluating apparatus is operated in the vacuum or in the atmosphere of the predetermined process gas to generate the many particles. The particle monitor detects the particles to calibrate the flying speed of the particle. Thus, when the flying speed of the fine particle is different from the flow rate of the process gas, the dust generation evaluating apparatus is disposed at the position corresponding to the position where the contact dust generation easily occurs, and is operated in the pulse manner to observe the generating particles by the plurality of particle monitors. It is thereby possible to correct the flying speed of the fine particle, resulting in an effect of an enhanced accuracy with which the dust position at which dust is abruptly generated is specified.

While preferred embodiments of the invention have been described using specific terms, such description is for illustrative purposes only, and it is to be understood that changes and variations may be made without departing from the spirit or scope of the following claims.

What is claimed is:

1. A semiconductor manufacturing apparatus comprising:
   a process chamber in which a semiconductor wafer is accommodated, a thin film is deposited on the semiconductor wafer, and the deposited thin film is etched by plasma or an internally adhered deposit is cleaned by plasma thereby generating a number of particles;
   a plurality of exhaust pipes mounted to a plurality of positions in the process chamber;
   a plurality of particle monitors respectively mounted to said plurality of exhaust pipes to count the number of particles being generated at a time of the plasma etching or the plasma cleaning;
   a signal processor connected to said plurality of particles monitors to perform a calculation to find a position of particle generation based on particle generation time detection signals generated and transmitted from the plurality of particle monitors; and
   an end point detection controller connected to said plurality of particles monitors to observe the number of particles counted by the plurality of particle monitors in time sequence so as to detect an end point time of the plasma etching or the plasma cleaning, and control an operation in which the plasma etching or the plasma cleaning is terminated.

2. A semiconductor manufacturing apparatus according to claim 1, further comprising a plurality of isolation valves mounted to a plurality of exhaust pipes wherein the plurality isolation valves connect the process chamber to the plurality of particle monitors to isolate the process chamber from the plurality of particle monitors.

3. A semiconductor manufacturing apparatus according to claim 2, wherein a gate valve or a ball valve is used as the isolation valve.

4. A semiconductor manufacturing apparatus according to claim 1, wherein the process chamber accommodates a dust generation evaluating apparatus including a magnetic member with a surface to which a blast process is made by a blast material having a diameter, and member deforming means for deforming the magnetic member to discharge a residual blast material.

5. A semiconductor manufacturing apparatus according to claim 4, wherein the magnetic member is made of stainless, and the member deforming means including a supporting pedestal to support a magnetic stainless plate in a cantilever beam manner, and an electromagnet to attract and repulse a free end of the stainless plate.

6. A semiconductor manufacturing apparatus comprising:

a process chamber in which a semiconductor wafer is accommodated, a thin film is deposited on the semiconductor wafer, and the deposited thin film is etched by plasma or an internally adhered deposit is cleaned by plasma thereby generating a number of particles;

an exhaust pipe to exhaust a gas in the process chamber;

a particle monitor mounted to a part of the exhaust pipe to count the number of particles being generated at a time of the plasma etching or the plasma cleaning; and an end point detection controller connected to said particle monitor to observe the number of particles counted by the particle monitor in time sequence so as to detect an end point time of the plasma etching or the plasma cleaning, and control an operation in which the plasma etching or the plasma cleaning is terminated, wherein the process chamber accommodates a dust generation evaluating apparatus including a magnetic member with a surface to which a blast process is made by a blast material having a particle diameter, and member deforming means for deforming the magnetic member to discharge a residual blast material.

7. A semiconductor manufacturing apparatus according to claim 6, wherein the magnetic member is made of stainless, and the member deforming means includes a supporting pedestal to support a magnetic stainless plate in a cantilever beam manner, and an electromagnet to attract and repulse a free end of the stainless plate.

* * * * *